(12) United States Patent
Lin et al.

(10) Patent No.: US 9,799,770 B2
(45) Date of Patent: Oct. 24, 2017

(54) FINFET STRUCTURE DEVICE

(71) Applicant: UNITED MICROELECTRONICS CORP., Hsin-Chu (TW)

(72) Inventors: Ting-Yao Lin, Taichung (TW); Ling-Chun Chou, Yun-Lin County (TW); Kun-Hsien Lee, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/064,618

(22) Filed: Mar. 9, 2016

(65) Prior Publication Data
US 2017/0243977 A1 Aug. 24, 2017

(30) Foreign Application Priority Data

Feb. 22, 2016 (CN) .......................... 2016 1 0096049

(51) Int. Cl.
| | |
|---|---|
| *H01L 29/78* | (2006.01) |
| *H01L 29/423* | (2006.01) |
| *H01L 29/08* | (2006.01) |
| *H01L 29/167* | (2006.01) |
| *H01L 29/165* | (2006.01) |

(52) U.S. Cl.
CPC ...... *H01L 29/7851* (2013.01); *H01L 29/0865* (2013.01); *H01L 29/0882* (2013.01); *H01L 29/165* (2013.01); *H01L 29/167* (2013.01); *H01L 29/4236* (2013.01); *H01L 29/7825* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 8,994,026 B2 | 3/2015 | Voldman | |
| 9,324,827 B1* | 4/2016 | Singh | H01L 29/785 |
| 2010/0006937 A1* | 1/2010 | Lee | H01L 21/82380 |
| | | | 257/343 |
| 2016/0149030 A1* | 5/2016 | Kim | H01L 29/7816 |
| | | | 257/337 |
| 2016/0181358 A1* | 6/2016 | Zhang | H01L 29/66689 |
| | | | 257/339 |
| 2016/0190269 A1* | 6/2016 | Brown | H01L 29/66659 |
| | | | 257/343 |

OTHER PUBLICATIONS

Chen, Title of Invention: A High-Voltage FinFET Device Having LDMOS Structure and Method for Manufacturing the Same, U.S. Appl. No. 14/583,771, filed Dec. 29, 2014.

* cited by examiner

*Primary Examiner* — Michelle Mandala
(74) *Attorney, Agent, or Firm* — Winston Hsu

(57) ABSTRACT

The present invention provides a FinFET device, including at least one fin structure, wherein the fin structure has a first-type well region, and a second-type well region adjacent to the first-type well region, a trench located in the fin structure and disposed between the first-type well region and the second-type well region, an insulating layer disposed in the trench, and a metal gate crossing over and disposed on the insulating layer.

19 Claims, 7 Drawing Sheets

FINFET STRUCTURE DEVICE

BACKGROUND OF THE INVENTION

1. Field of the Invention

The invention relates to a high voltage metal-oxide-semiconductor (hereinafter abbreviated as HV MOS) device, and more particularly, to a high voltage lateral double-diffused metal-oxide-semiconductor (HV-LDMOS) device.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor devices and lateral double-diffused MOS (LDMOS) transistor devices. Having advantages of higher operational bandwidth, higher operational efficiency, and convenience to be integrated with other integrated circuit due to its planar structure, LDMOS transistor devices are prevalently used in high operational voltage environments, such as CPU power supplies, power management systems, AC/DC converters, and high-power or high frequency (HF) band power amplifiers. The essential feature of LDMOS transistor devices is a lateral-diffused drift region with low dope concentration and large area. The drift region is used to alleviate the high voltage between the drain and the source; therefore the LDMOS transistor device can have higher breakdown voltage.

It is well-known that characteristics of high element density and high breakdown voltage are always required for the HV MOS transistor device. However, breakdown voltage and element density are conflicting parameters with a trade-off relationship. Therefore, a HV LDMOS transistor device that is able to realize high breakdown voltage but without decreasing the element density is still needed.

SUMMARY OF THE INVENTION

The object of the present invention is to provide a high-voltage FinFET device having an LDMOS structure and method for manufacturing the same, for promoting the ability of raising the breakdown voltage of the drain, and resolving the problem of the device density lowering.

For solving the above conventional problem, the present invention provides a FinFET device, the FinFET device comprising at least one fin structure, wherein the fin structure has a first-type well region, and a second-type well region adjacent to the first-type well region, a trench located in the fin structure and disposed between the first-type well region and the second-type well region, an insulating layer disposed in the trench, and a metal gate crossing over and disposed on the insulating layer.

According to another preferred embodiment of the present invention, a FinFET device is provided. The FinFET device comprises at least one fin structure, wherein the fin structure has a first-type well region and a second-type well region adjacent to the first-type well region, a well junction is disposed between the first-type well region and the second-type well region, a trench located in the fin structure and disposed between the first-type well region and the second-type well region, an insulating layer disposed in the trench, and a metal gate crossing over and disposed on the insulating layer, wherein a sidewall of the metal gate is aligned with the well junction.

Accordingly, the present invention provides a high-voltage FinFET device having an LDMOS structure and method for manufacturing the same. By means of defining a shallow trench isolation structure located between the drain doped layer and the working gate, which is adjacent to the underside of the dummy gate of the drain doped layer, it can not only widen the distance between the source doped layer and the drain doped layer, but also promote the ability of raising the breakdown voltage of the drain. Furthermore, because the first dummy gate, the working gate, the drain doped layer and the source doped layer are disposed on the same high-voltage FinFET device, the present invention can avoid the problem of the device density lowering.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1 to 8 are a plurality of diagrams of a method for manufacturing a high-voltage FinFET device having an LDMOS structure according to the first preferred embodiment of the present invention, wherein:

FIG. 1 shows forming a fin structure on a substrate;

FIG. 2 shows forming an insulating layer in the fin structure;

FIG. 3 shows forming a plurality of dummy gate stack structures on the fin structure;

FIGS. 4-5 show forming a plurality of epitaxial layers on the fin structure;

FIG. 6 shows forming an insulating layer on the fin structure, and performing an ion implantation process to the epitaxial layers;

FIGS. 7-8 show forming a plurality of metal gate structures on the fin structure.

FIGS. 9 to 10 illustrate a method for manufacturing a high-voltage FinFET device having an LDMOS structure according to the second preferred embodiment of the present invention, wherein:

FIG. 9 shows forming a plurality of dummy gate stack structures on the fin structure;

FIG. 10 shows forming a plurality of metal gate structures on the fin structure.

DETAILED DESCRIPTION

FIGS. 1 to 8 are a plurality of schematic diagrams of a high-voltage FinFET device having an LDMOS structure according to the first preferred embodiment of the present invention. The detailed steps of the method for manufacturing the high-voltage FinFET device having an LDMOS structure will be described as follows.

Figure 1:
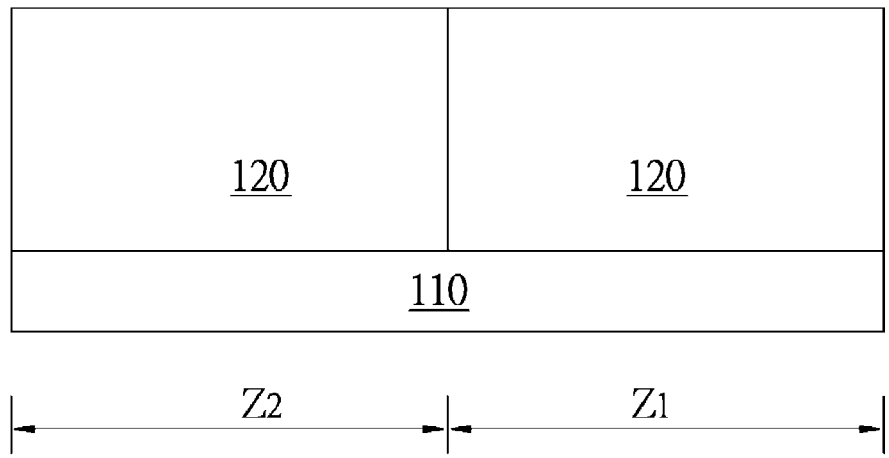

Please refer to FIG. 1, firstly, a substrate 110 is provided with at least one fin structure 120 thereon. The substrate 110 can be, for example, a semiconductor substrate. The fin structure 120 defines a first type well region Z1 and a second type well region Z2 adjacent to the first type well region Z1. The first type well region Z1 and the second type well region Z2 have complementary conductivity type, for example, the first type well region Z1 is an n-type well region, and the second type well region Z2 is a p-type well region. Or in another case, the first type well region Z1 is a p-type well region, and the second type well region Z2 is an n-type well region.

Figure 2:
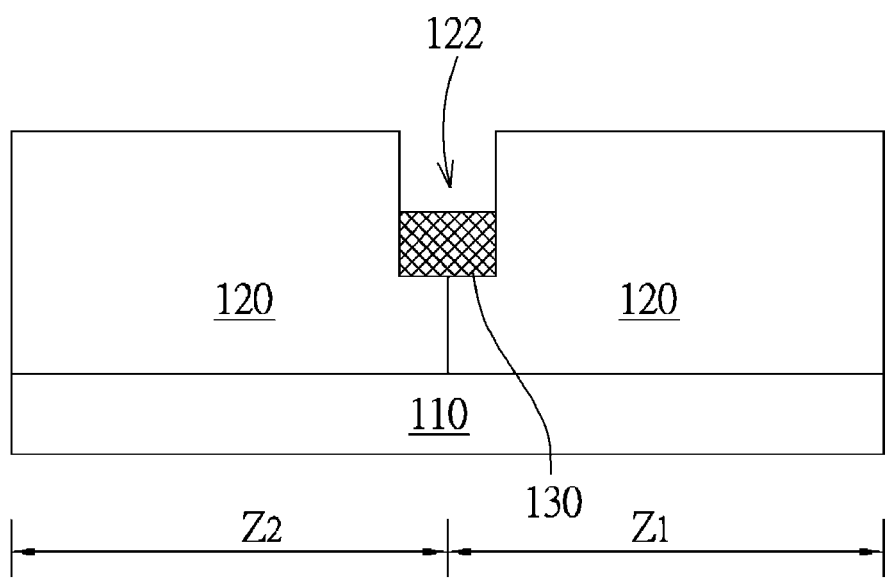

Next, please refer to FIG. 2, a trench 122 is formed on the fin structure 120 by means of photo-mask process and etching process. It is noteworthy that the trench 122 is formed at the interface between the first type well region Z1 and the second type well region Z2. In other words, the trench 122 partially overlaps both the first type well region Z1 and the second type well region Z2. Then, a shallow trench isolation structure 130 is formed at the trench 122, wherein the shallow trench isolation structure 130 only fills up a (partial) portion of the space of the trench 122, so the top surface of the shallow trench isolation structure 130 is lower than the top surface of the fin structure 120.

Figure 3:
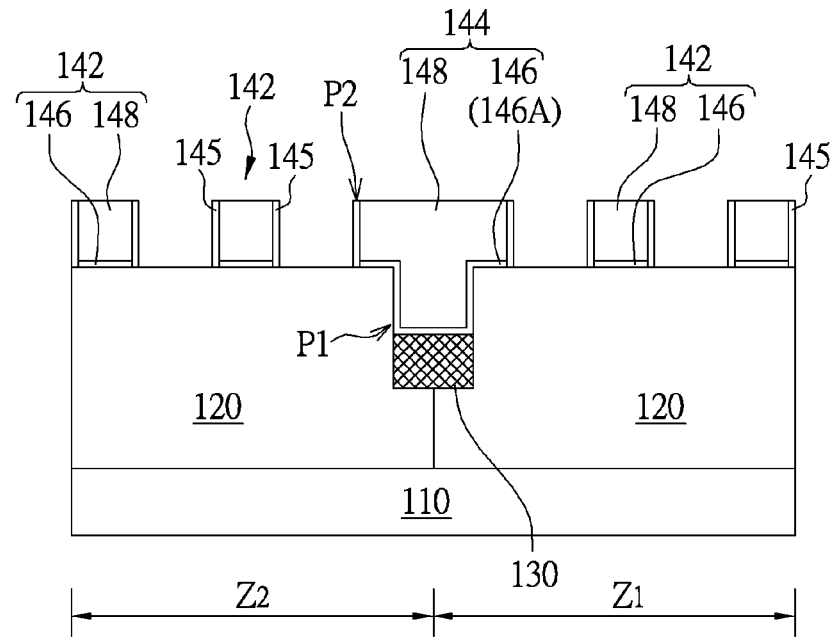

Referring to FIG. 3, after the process of forming a shallow trench isolation structure 130 in the trench 122, then a plurality of dummy gate stack structures 142 are formed crossing over and on the fin structure 120, and at least one gate stack structure 144 is formed on the fin structure 120 and partially filled in the trench 122. In this embodiment, the dummy gate stack structures 142 may be disposed within the first type well region Z1 or the second type well region Z2, and the gate stack structure 144 is disposed between the first type well region Z1 and the second type well region Z2 (partially overlaps with the first type well region Z1 and the second type well region Z2). In addition, the dummy gate stack structures 142 do not contact to each other, and the dummy gate stack structures 142 do not contact the gate stack structure 144 directly either.

The method of forming the dummy gate stack structures 142 and the gate stack structure 144 includes the steps of: firstly, forming a gate oxidizing layer 146 on an inside wall of the trench 122, then forming a dummy gate layer 148 (such as a polysilicon layer) on the gate oxidizing layer 146. It is noteworthy that the dummy gate layer 148 is not only filling up the trench 122, but is also disposed above the fin structure 120. Afterwards, an etching process is performed, so as to remove parts of the gate oxidizing layer 146 and parts of the dummy gate layer 148, and to form the dummy gate stack structures 142 and the gate stack structure 144. Moreover, because the gate stack structure 144 is formed in the trench 122 and disposed on the shallow trench isolation structure 130, the gate stack structure 144 has a vertical extension portion P1 and a horizontal extension portion P2. The vertical extension portion P1 fills up the trench 122 and is positioned on the shallow trench isolation structure 130. The horizontal extension portion P2 is positioned on the fin structure 120, and the direction of the horizontal extension portion P2 is vertical with respect to the extension direction of the fin structure 120.

It is noteworthy that since the gate oxidizing layer 146 (it is labeled as 146A in FIG. 3) of the gate stack structure 144 is conformally formed along the surface of the trench 122, so the gate oxidizing layer 146A has a "U-shaped" profile. Besides, each dummy gate stack structure 142 also includes the gate oxidizing layer 146 and the dummy gate layer 148, but the gate oxidizing layer 146 and the dummy gate layer 148 of the dummy gate stack structure 142 are flat structures.

Figure 4:
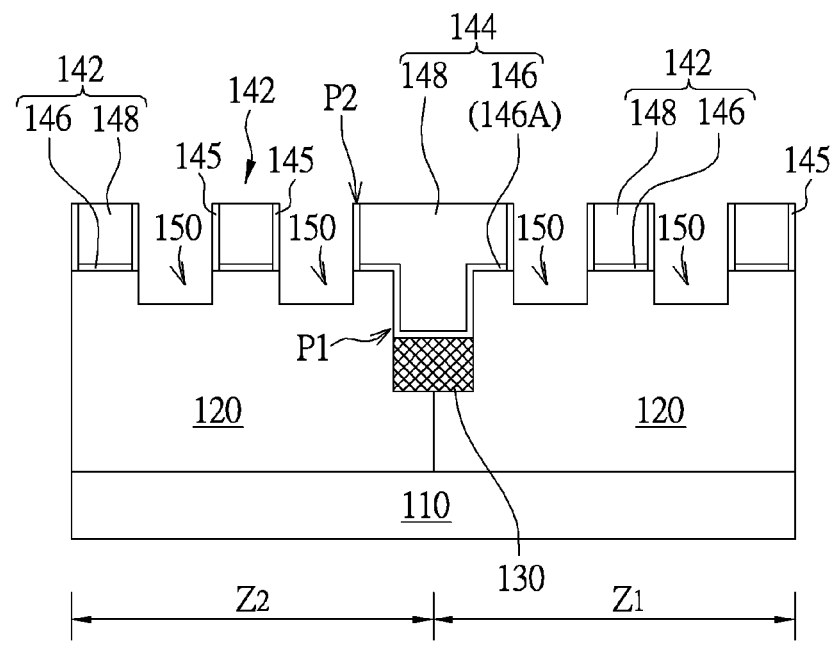
Figure 5:
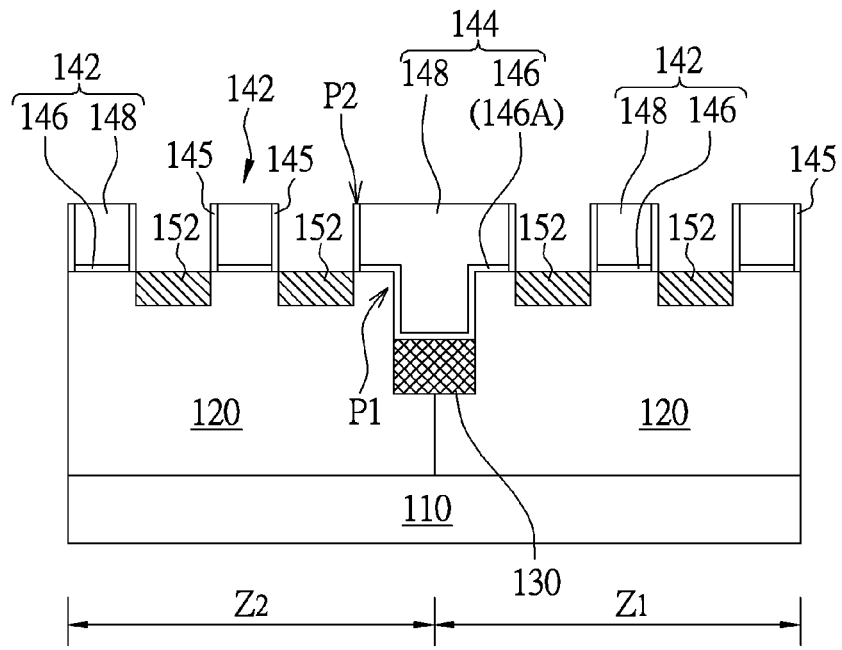

Please refer to FIG. 4 and FIG. 5, after forming the dummy gate stack structures 142 and the gate stack structure 144, then, a plurality of (discontinuous) openings 150 are formed in the fin structure 120. Afterwards, as shown in FIG. 5, a plurality of epitaxial material layers 152 are grown on the plurality of openings 150. Preferably, the upper surface of the epitaxial material layers 152 and a top surface of the fin structure 120 are on a same level, but not limited thereto. Besides, in this embodiment, the openings 150 and the epitaxial material layers 152 are formed. However, in another embodiment of the present invention, the step for forming the openings 150 and the epitaxial material layers 152 can be omitted, and it should also be within the scope of the present invention.

Figure 6:
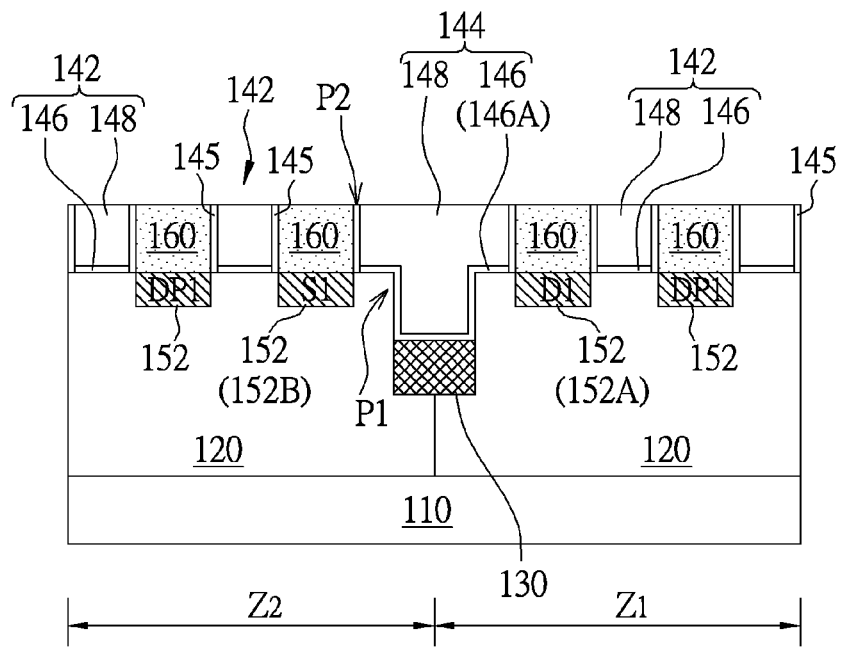

Please refer to FIG. 6, after forming the epitaxial material layers 152, then a doping process (ion implantation process) is performed toward the epitaxial material layers 152 of the openings 150, to form a drain doped layer D1 on the epitaxial material layer 152 which is adjacent to one side of the shallow trench isolation structure 130 (labeled as 152A) disposed within the first type well region Z1, to form a source doped layer S1 on the epitaxial material layer 152 which is adjacent to another side of the shallow trench isolation structure 130 (labeled as 152B) disposed within the second type well region Z2, and to form a plurality of first type doped layers DP1 on the rest epitaxial material layers 152. Therefore, the first type doped layer DP1 may be disposed within the first type well region Z1 or within the second type well region Z2, but not disposed between the drain doped layer D1 and the source doped layer S1. It is noteworthy that in another embodiment, if the epitaxial material layers 152 are omitted, the doping process (ion implantation process) will be performed on the fin structure 120 directly.

Besides, the drain doped layer D1, the source doped layer S1 and the first type doped layer DP1 have the same conductivity type as the first type well region Z1 does. For example, if the first type well region Z1 is an n-type well region, the second type well region Z2 is a p-type well region, therefore, the first type doped layer DP1, the drain doped layer D1 and the source doped layer S1 are n-type doped layers by doping suitable ions (such as phosphorus ions or arsenic ions). Furthermore, the epitaxial material layers 152 may comprise a phosphorus-doped-silicon epitaxial layer, to further provide the tensile stress to the channel, but not limited thereto. In this case, the present invention defines the high-voltage FinFET device as an n-type high-voltage FinFET device.

However, in another case, if the first type well region Z1 is a p-type well region, the second type well region Z2 is an n-type well region. Therefore, the first type doped layer DP1, the drain doped layer D1 and the source doped layer S1 are p-type doped layers by doping suitable ions (such as baron ions). Furthermore, the epitaxial material layers 152 may comprise a silicon-germanium epitaxial layer, to further provide the compression stress to the channel, but not limited thereto. In this case, the present invention defines the high-voltage FinFET device as a p-type high-voltage FinFET device.

Next, an insulating layer (not shown) is entirely formed on the fin structure, covering each dummy gate stack structure 142 and the gate stack structure 144, the insulating layer mentioned above such as a silicon nitride layer or other suitable insulating materials. Afterwards, a planarization process, such as a chemical mechanical planarization (CMP) process is performed, to remove the extra insulating layer, and to expose each dummy gate stack structure 142 and the gate stack structure 144. Hence, a plurality of insulating layers 160 are formed on the epitaxial material layers 152, where the insulating layer 160 fills into the space between the dummy gate stack structure 142 and the gate stack structure 144, or fills into the space between two adjacent dummy gate stack structures 142.

Figure 7:
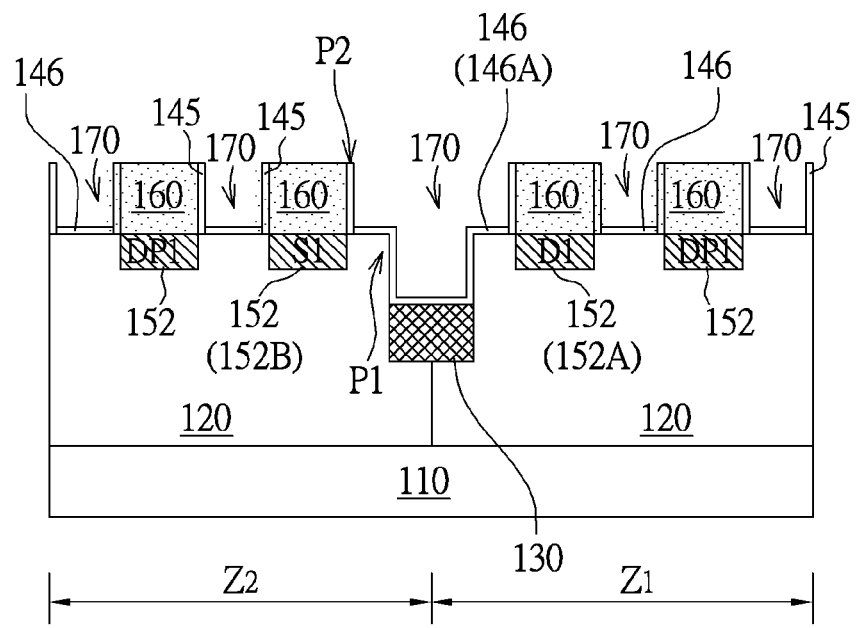
Figure 8:
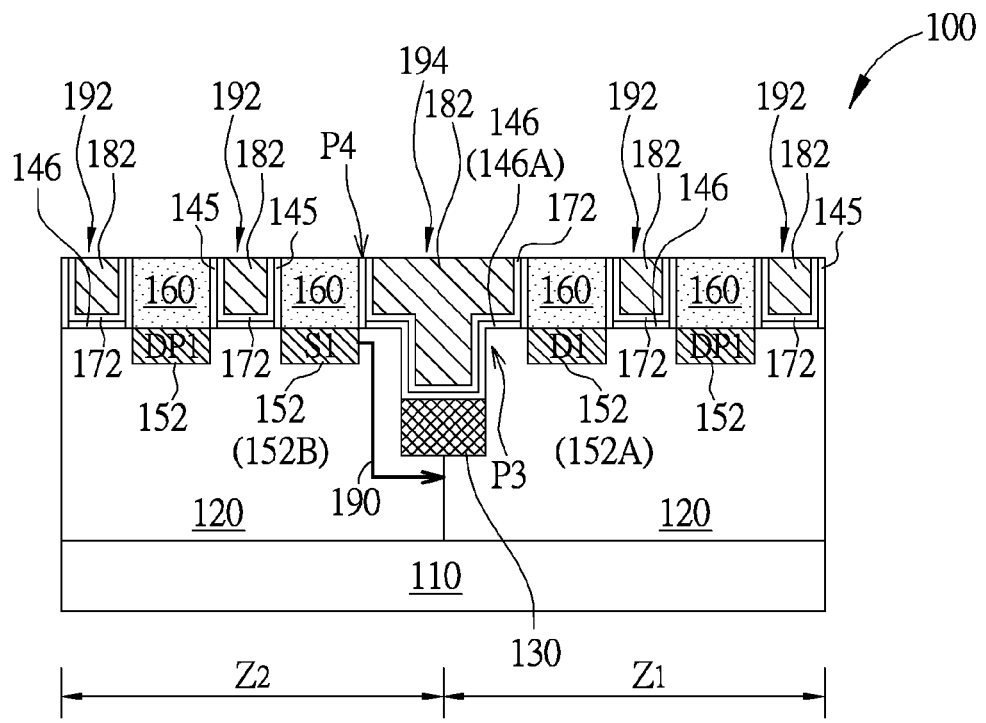

After the drain doped layer D1, the source doped layer S1 and the plurality of first type doped layer DP1 mentioned above are completed, a RMG (replacement metal gate) process is then performed, to replace the dummy gate stack structure 142 and the gate stack structure 144 into metal gates. As shown in FIGS. 7-8, the above RMG process steps include: firstly, removing the dummy gate layer 148 of dummy gate stack structure 142 and the gate stack structure 144, to form a plurality of openings 170 between the insulating layers 160. The method for removing the dummy gate layer 148 can be performed with an etching process. It is noteworthy that in FIG. 7 of the present invention, the gate oxidizing layer 146 is not removed, however, in another embodiment of the present invention, the RMG process can optionally remove the gate oxidizing layer 146 positioned under the dummy gate layer 148, and it should also be within the scope of the present invention. In addition, if the gate oxidizing layer 146 is removed in this step, another gate oxidizing layer needs to be formed between the metal gate and the fin structure 120 in the following steps. It can be formed such as through an in-situ steam generation (ISSG) process, but is not limited thereto.

Next, as shown in FIG. 8, a high dielectric (high-k) material layer 172 are filled in each opening 170, and a conductive layer 182 is then formed on the high-k material layer 172, to complete a plurality of gate structure 192 and at least one gate structure 194. Both the gate structure 192 and the gate structure 194 include the gate oxidizing layer 146, the high-k material layer 172 and the conductive layer 182. Besides, the shape of the gate structure 192 and the gate structure 194 are respectively the same as the shape of the dummy gate stack structure 142 and the gate stack structure 144. Therefore, the gate structure 194 also has a vertical extension portion P3 and a horizontal extension portion P4 (which correspond to the vertical extension portion P1 and a horizontal extension portion P2 shown in FIG. 3 respectively).

In this embodiment, the material of the high-k dielectric material layer 172 comprises a dielectric constant (k value) larger than 4, such as metallic oxide, hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta2O_9$, SBT), lead zirconate titanate ($PbZr_xTi_{1-x}O_3$, PZT), barium strontium titanate ($Ba_xSr_{1-x}TiO_3$, BST) or a combination thereof. The conductive layer 182 includes a work function metal layer and/or materials with low resistance and superior gap-filling characteristic, such as W, Al, TiAl, or titanium aluminum oxide (TiAlO), but not limited to this. After this step, the high-voltage FinFET device 100 having an LDMOS structure according to the first preferred embodiment of the present invention is completed.

It is noteworthy that the gate structure 194 is disposed between the drain doped layer D1 and the source doped layer S1, and is also disposed above the shallow trench isolation structure 130. One feature of the present invention is that during the operation of the high-voltage FinFET device 100 having an LDMOS structure, since the gate structure 194 is disposed between the first type well region Z1 and the second type well region Z2, which is used to control the on/off status of the FinFET device, it generally functions as a working gate, and the rest of the gate structures 192 are deemed as the dummy gates. One purpose of the present invention is to increase the breakdown voltage of the LDMOS, therefore, the shallow trench isolation structure 130 is formed under the gate structure (working gate) 194. The shallow trench isolation structure 130 is disposed between the drain doped layer D1 and the source doped layer S1, to prevent the punch through phenomenon between the source and the drain from occurring, thereby avoiding the leakage current issues. In other words, by forming the shallow trench isolation structure 130, the channel 190 (from the source doped layer S1 to the first type well region Z1) of the LDMOS only can be formed under the shallow trench isolation structure 130, so the channel length is increased, and therefore the breakdown voltage of the LDMOS can be improved. Compared with conventional LDMOS structure, since the shallow trench isolation structure 130 is only disposed in the fin structure, even though the channel length is increased, it will not accumulate more device surface area. In other words, the size of each LDMOS unit (when viewed in a cross section view, it's also the horizontal distance between the source doped layer S1 and the drain doped layer D1) will not be increased. In summary, the LDMOS of the present invention is applied to the conventional LDMOS structure.

In addition, the present invention provides another advantage that since the gate structure (working gate) 194 has a vertical extension portion P3 extending into the fin structure 120, so the area of the fin structure that is contacted by the working gate is increased, but without increasing the total device area. In this way, the controllability of the LDMOS can be improved too.

The following description will detail the different embodiments of the high voltage FinFET of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 9:
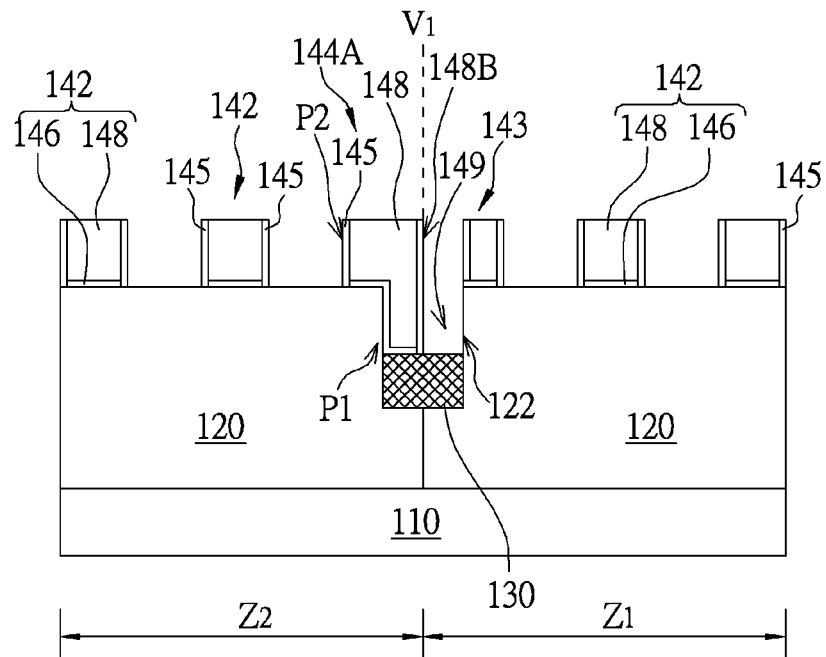
Figure 10:
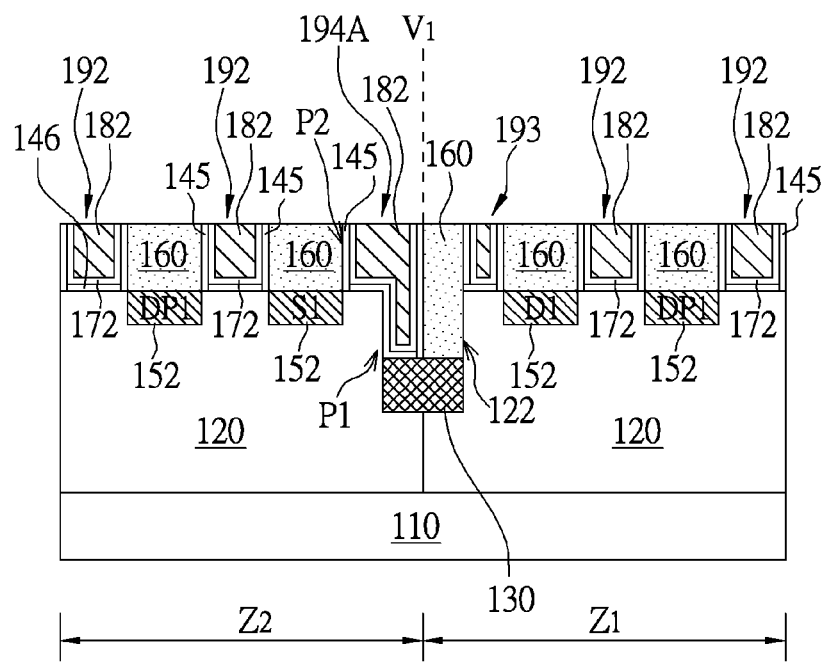

FIGS. 9 to 10 illustrate a method for manufacturing a high-voltage FinFET device having an LDMOS structure according to the second preferred embodiment of the present invention. In this embodiment, the high-voltage FinFET device also comprises a substrate 110, at least one fin structure 120, a first type well region Z1 and a second type well region Z2 defined on the fin structure 120, a trench 122 disposed at the interface between the first type well region Z1 and the second type well region Z2, and a shallow trench isolation structure 130 partially filled into the trench 122 (please also refer to FIGS. 1-2 mentioned above). The difference between this embodiment and the first preferred embodiment is that the gate stack structure 144A has a different structure than the gate stack structure 144 in the first preferred embodiment does. More precisely, after the gate stack structure 144 is formed (as shown in FIG. 3), an etching process is further performed, so as to form an opening 149 in parts of the trench 122, and divide the gate stack structure 144 into two parts: a gate stack structure 144A and a dummy gate stack structure 143. In this embodiment, the gate stack structure 144A does not fill up the trench 122, and one sidewall 148B of the gate stack structure 144A is aligned with the vertical interface axis (labeled as V1 in FIG. 9) between the first type well region Z1 and the second type well region Z2. Therefore, in this embodiment, the gate oxidizing layer 146 of the gate stack structure 144A has a "Z-shaped" profile.

Next, similarly to the methods mentioned in the first preferred embodiment, the following steps are performed in sequence, comprising: forming the epitaxial material layers;

performing the ion implantation process; forming the insulating layers; performed the RMG process . . . . These methods are the same as the methods mentioned in the first preferred embodiment, and will not be described again here. The final high-voltage FinFET device having an LDMOS structure according to the second preferred embodiment of the present is shown in FIG. 10, and one sidewall of the gate structure 194A is aligned with the vertical interface axis between the first type well region Z1 and the second type well region Z2. Besides, a gate structure 193 is disposed between the gate structure 194A and the drain doped layer D1. Except for the features mentioned above, the other components, material properties, and manufacturing method of this embodiment are similar to the first preferred embodiment detailed above and will not be redundantly described.

Figure 11:
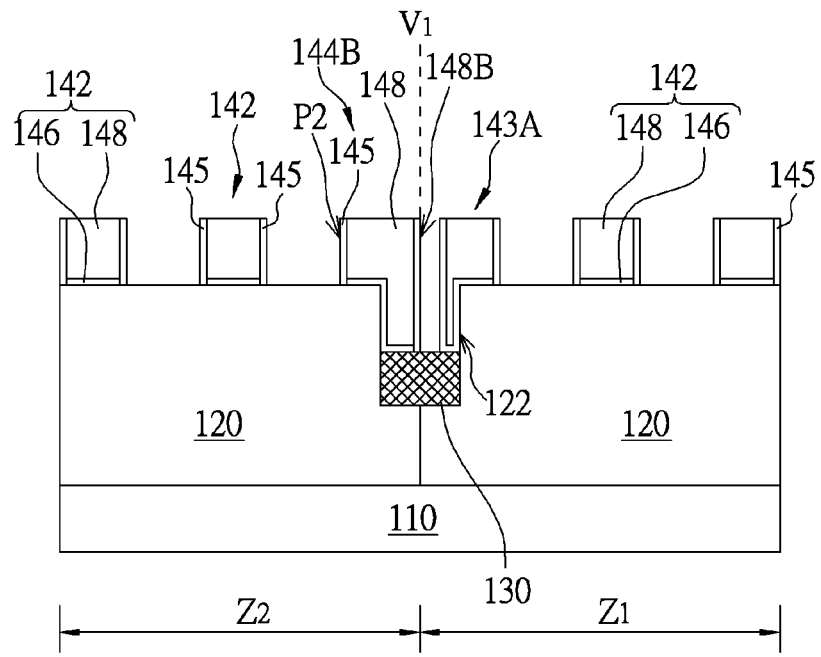
FIG. 11 illustrates a schematic diagram of a high-voltage FinFET device having an LDMOS structure according to the third preferred embodiment of the present invention.

Another embodiment of the present invention is shown in FIG. 11, which illustrates a schematic diagram of a high-voltage FinFET device having an LDMOS structure according to the third preferred embodiment of the present invention. Similar to the second preferred embodiment mentioned above, one sidewall 148B of the gate stack structure 144B is aligned with the vertical interface axis (labeled as V1 in FIG. 9) between the first type well region Z1 and the second type well region Z2. The difference between this embodiment and the second preferred embodiment is in this embodiment, the dummy gate stack structure 143A is disposed on the surface of the fin structure 120 and also partially filled into the trench 122. Except for the features mentioned above, the other components, material properties, and manufacturing method of this embodiment are similar to the second preferred embodiment detailed above and will not be redundantly described.

Figure 12:
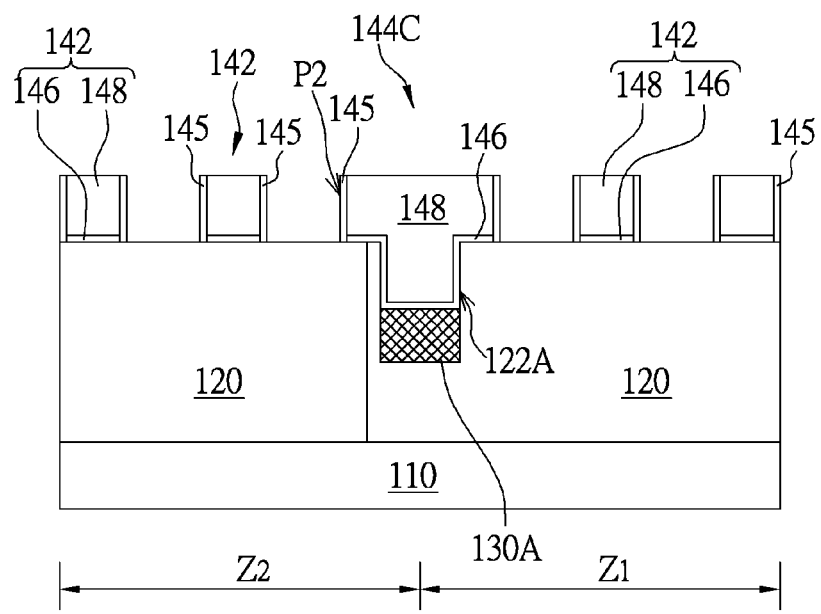
FIGS. 12-13 illustrate two schematic diagrams of a high-voltage FinFET device having an LDMOS structure according to another two preferred embodiments of the present invention.
Figure 13:
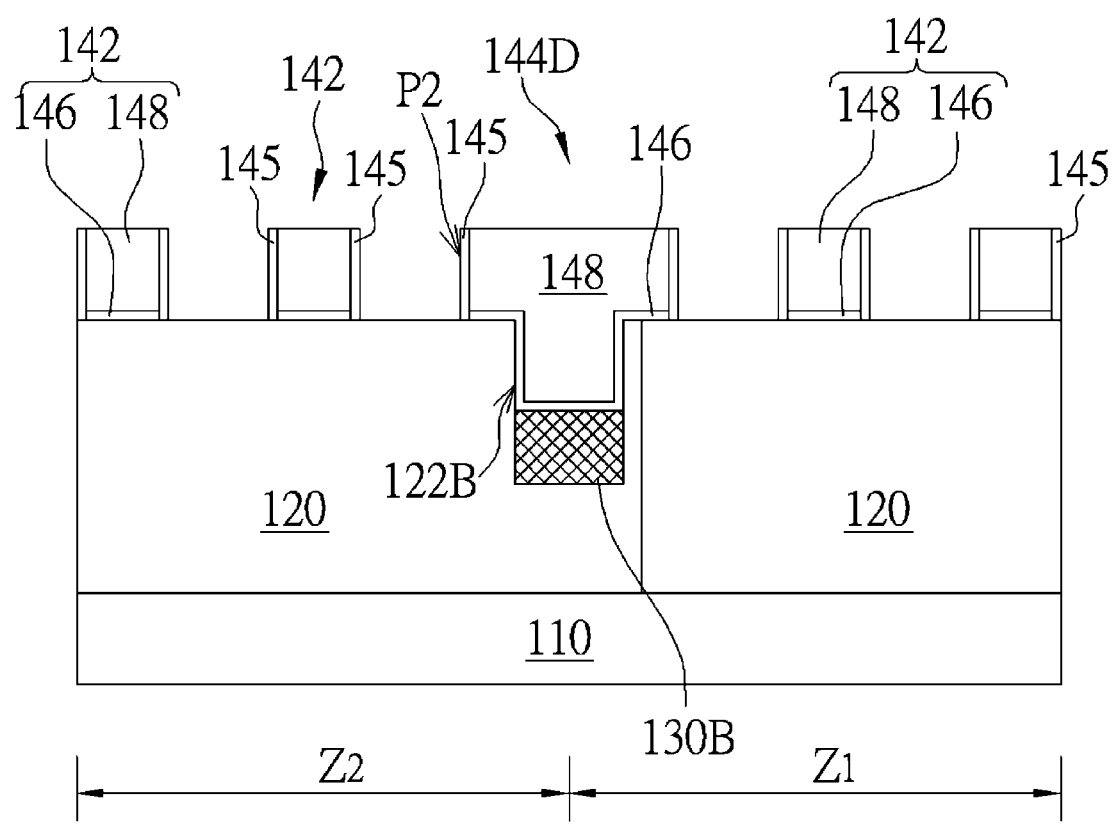

Another embodiment of the present invention is shown in FIGS. 12-13, which illustrate two schematic diagrams of a high-voltage FinFET device having an LDMOS structure according to another two preferred embodiments of the present invention. In one case, a trench 122A is not disposed at the interface between the first type well region Z1 and the second type well region Z2, but disposed within the first type well region Z1 (as shown in FIG. 12), and a gate stack structure 144C is disposed in the trench 122A and disposed above a shallow trench isolation structure 130A. Or in another case, a trench 122B is disposed within the second type well region Z2 (as shown in FIG. 13), and a gate stack structure 144D is disposed in the trench 122B and disposed above a shallow trench isolation structure 130B. This should also be within the scope of the present invention. Except for the features mentioned above, the other components, material properties, and manufacturing method of this embodiment are similar to the first preferred embodiment detailed above and will not be redundantly described.

As described above, the present invention provides a high-voltage FinFET device having an LDMOS structure. By means of defining a shallow trench isolation structure located under the working gate, it can not only widen the distance between the drain doped layer and source doped layer, but also promote the ability of raising the breakdown voltage of the drain. Furthermore, because the shallow trench isolation structure, the dummy gate, the working gate, the drain doped layer and the source doped layer are designed into the same high-voltage FinFET device, the present invention can avoid the problem of lowering device density. In other words, the high-voltage FinFET device of the present invention is compatible to conventional technologies, but without increasing the finFET device volume.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A FinFET device, comprising:
   at least one fin structure, wherein the fin structure has a first-type well region, and a second-type well region adjacent to the first-type well region;
   a trench located in the fin structure and disposed between the first-type well region and the second-type well region;
   an insulating layer disposed in the trench, wherein the insulating layer contacts the first-type well region and the second-type well region directly; and
   a metal gate crossing over and disposed on the insulating layer, wherein the FinFET device is a high-voltage FinFET device having lateral diffusion laterally diffused metal oxide semiconductor (LDMOS) structure.

2. The FinFET device of claim 1, wherein the metal gate has a vertical extension portion and a horizontal extension portion connected with the vertical extension portion.

3. The FinFET device of claim 2, wherein the vertical extension portion extends into the fin structure.

4. The FinFET device of claim 1, further comprising a plurality of dummy gates crossing over and disposed on the fin structure.

5. The FinFET device of claim 4, wherein each dummy gate and the metal gate includes a metal gate material layer and a high-k material layer respectively, the high-k material layer disposed between the fin structure and the metal gate material layer.

6. The FinFET device of claim 4, further comprising a source doped layer disposed in the first-type well region, and a drain doped layer disposed in the second-type well region, wherein the source doped layer is disposed between the metal gate and one of the dummy gate, and the drain doped layer is disposed between the metal gate and another dummy gate.

7. The FinFET device of claim 6, wherein the first-type well region is an n-type well region, the second-type well region well region is a p-type well region, and the drain doped layer and the source doped layer are n-type doped layers.

8. The FinFET device of claim 7, wherein the drain doped layer and the source doped layer are phosphorus-doped-silicon epitaxial layers.

9. The FinFET device of claim 6, wherein the first-type well region is a p-type well region, the second-type well region well region is an n-type well region, and the drain doped layer and the source doped layer are p-type doped layers.

10. The FinFET device of claim 9, wherein the drain doped layer and the source doped layer comprise silicon-germanium (SiGe) epitaxial layers.

11. A FinFET device, comprising:
    at least one fin structure, wherein the fin structure has a first-type well region and a second-type well region adjacent to the first-type well region, and a well junction is disposed between the first-type well region and the second-type well region;
    a trench located in the fin structure and disposed between the first-type well region and the second-type well region;
    an insulating layer disposed in the trench, wherein the insulating layer contacts the first-type well region and the second-type well region directly; and a metal gate crossing over and disposed on the insulating layer, wherein a sidewall of the metal gate is aligned with the well junction, wherein the FinFET device is a high-voltage FinFET device having lateral diffusion laterally diffused metal oxide semiconductor (LDMOS) structure.

12. The FinFET device of claim 11, further comprising a plurality of dummy gates crossing over and disposed on the fin structure.

13. The FinFET device of claim 12, further comprising a source doped layer disposed in the first-type well region, and a drain doped layer disposed in the second-type well region, wherein the source doped layer is disposed between the metal gate and one of the dummy gate, and the drain doped layer is disposed between the metal gate and another dummy gate.

14. The FinFET device of claim 13, at least one dummy gate disposed between the metal gate and the drain doped layer.

15. The FinFET device of claim 14, wherein parts of the at least one dummy gate are partially disposed in the trench.

16. The FinFET device of claim 13, wherein the first-type well region is an n-type well region, the second-type well region well region is a p-type well region, and the drain doped layer and the source doped layer are n-type doped layers.

17. The FinFET device of claim 13, wherein the first-type well region is a p-type well region, the second-type well region well region is an n-type well region, and the drain doped layer and the source doped layer are p-type doped layers.

18. The FinFET device of claim 12, wherein each dummy gate and the metal gate includes a metal gate material layer and a high-k material layer respectively, the high-k material layer disposed between the fin structure and the metal gate material layer.

19. The FinFET device of claim 12, wherein a top surface of the insulating layer is lower than a top surface of the fin structure.

* * * * *